United States Patent [19]

Gutierrez

[11] 4,305,083

[45] Dec. 8, 1981

[54] SINGLE JUNCTION CHARGE INJECTOR FLOATING GATE MEMORY CELL

[75] Inventor: Jean M. Gutierrez, Antibes, France

[73] Assignee: Texas Instruments Incorporated, Dallas, Tex.

[21] Appl. No.: 73,152

[22] Filed: Sep. 7, 1979

[30] Foreign Application Priority Data

Sep. 19, 1978 [FR] France ........................ 78 26803
Apr. 10, 1979 [FR] France ........................ 79 09006

[51] Int. Cl.³ .................. H01L 29/78; H01L 27/02; H01L 29/34
[52] U.S. Cl. ........................... 357/23; 357/42; 357/51; 357/54
[58] Field of Search .............. 357/23, 41, 42, 54, 357/51

[56] References Cited

U.S. PATENT DOCUMENTS

| | | | |
|---|---|---|---|
| 4,035,820 | 7/1977 | Matzen | 357/23 |
| 4,037,242 | 7/1977 | Gosney | 357/41 |
| 4,106,045 | 8/1978 | Nishi | 357/23 |
| 4,158,238 | 6/1979 | Erb | 357/23 |
| 4,163,985 | 8/1979 | Schuermeyer | 357/23 |
| 4,222,063 | 9/1980 | Rodgers | 357/23 |

OTHER PUBLICATIONS

IBM Technical Disclosure Bulletin, by Terman, vol. 14, No. 12, May 1972, p. 3721.
IBM Technical Disclosure Bulletin, by James, vol. 16, No. 2, Jul. 1973, pp. 690 and 691.

*Primary Examiner*—Andrew J. James
*Attorney, Agent, or Firm*—Melvin Sharp; Gary Honeycutt; N. Rhys Merrett

[57] ABSTRACT

A single charge injector, floating gate memory cell wherein the injector diode is defined by an ion implanted region of opposite conductivity type from that of the semiconductor substrate and by a diffused region having the same conductivity type as but higher conductivity than the substrate. Equal hole and electron injection efficiencies can be obtained from this single charge injector. A three terminal access cell having a compact structure is obtained by use of a thick oxide read transistor located between the injector diode and the bootstrap capacitor. The read transistor together with a single address transistor for the cell are connected to the injector diode.

14 Claims, 15 Drawing Figures

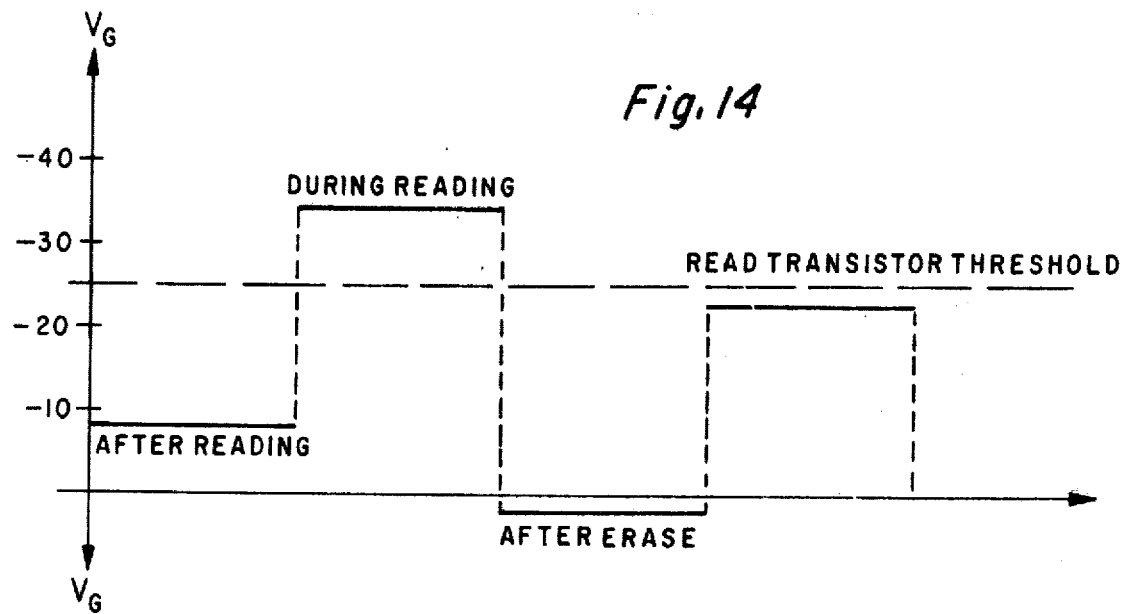
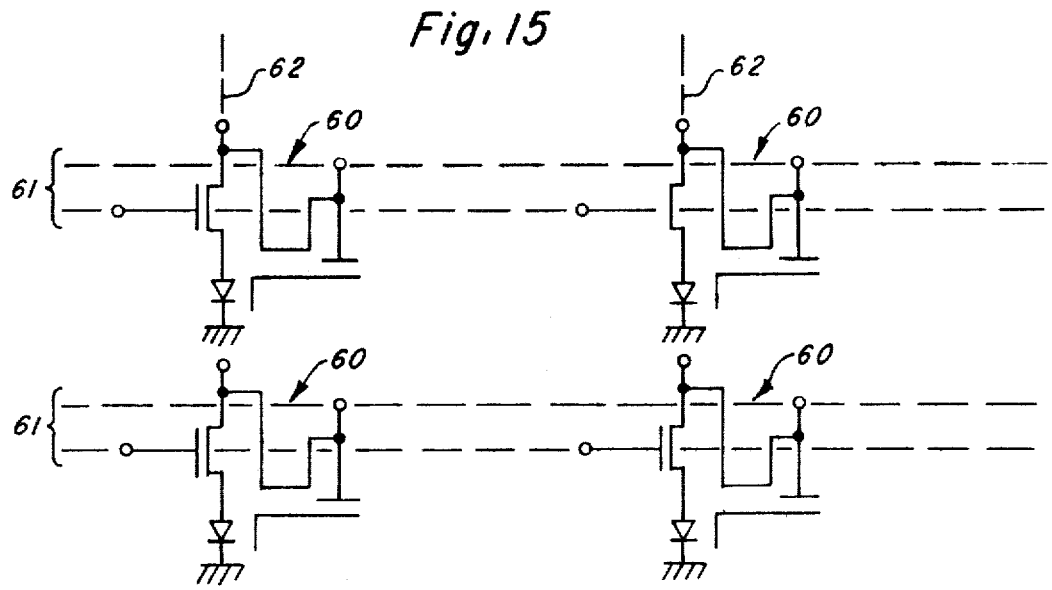

SINGLE JUNCTION CHARGE INJECTOR FLOATING GATE MEMORY CELL

The present invention relates to memory cells and more particularly to charge injector, floating gate memory cells. For example, electrically reprogrammable non-volatile memory cells.

One known type of charge injector, floating gate memory cell is disclosed in U.S. Pat. No. 4,037,242 issued July 19, 1977 and diagrammatically illustrated by FIG. 1 herein. The memory cell has two charge injectors and comprises an aluminum floating gate 21 intended to control an electron injector 2 and a hole injector 3. To the floating gate 1 there is also connected to read transistor 4, while to each of the injectors 2 and 3 is respectively connected an address transistor 5, 6. The gate electrode of the address transistor 6 is connected to the floating gate by a coupling capacitor 7. The source electrodes of the address transistors 5 and 6 are connected to a terminal 8 for writing, erasing and reading the cell. The drain transistor for the read transistor 4 constitutes the read terminal of the cell. The cross-hatched regions of the cell shown in FIG. 1 are the regions in which the floating gate 1 is only separated from the substrate by a thin (e.g. about 1,000 Angstroms) isolating layer, typically of silicon dioxide. This known memory cell functions in the following manner.

During the write operation, the address transistor 5 only is made conductive and the diode 2 forming the electron injector and constituted by a p+/n junction is biased into avalanche by application to the terminal 8 of a potential more negative than the breakdown potential. Under these conditions, hot electrons generated by avalanche breakdown are injected through the thin oxide layer onto the floating gate 1 which also is charged to a negative potential. During this operation, the terminal 9 of the read transistor is maintained floating.

During the read operation, the address transistor 5 alone is made conductive. The terminal 9 is maintained at zero potential and a negative potential, less than the breakdown potential of the electron injector 2 is applied to the terminal 8. The potential of the floating gate 1 being more negative than the threshold potential of read transistor 4, the latter becomes conductive.

During the erase operation, the address transistor 6 alone is made conductive and the hole injector diode 3, constituted by an n+/p junction is avalanched by the application to the terminal 8 of a potential more negative than the breakdown potential. During avalanching, the floating gate is charged by capacitive coupling by the capacitor 7 to a more negative potential than that of the substrate and consequently holes are injected through the thin oxide layer towards the floating gate 1 raising it to a slightly positive potential. Reading is effected under the same conditions outlined above. Since the floating gate 1 is held at a potential greater than the threshold voltage of the read transistor 4, the latter is blocked. This memory cell has four access terminals.

U.S. patent application Ser. No. 839,722 filed Oct. 5, 1977 now continued as application Ser. No. 161,524 filed Aug. 18, 1980 by Jean F. Ciroux et al. for "Single Injector Floating Gate Memory," the disclosure of which is incorporated herein by reference, describes an improved memory cell of this general type but comprising a single junction forming a charge injector, operable to inject either electrons or holes into the floating gate at the time of application to that junction of a reverse potential at least equal to the avalanche threshold of the junction, together with means for controlling operation of the junction to operate in either the electron injection mode or in the hole injection mode. Such a memory cell structure is shown in FIG. 2 and comprises an n type substrate 11 in the upper surface of which are formed by ion implantation an n type doped region 12 and a p type doped region 13, defining between them a junction 14. The regions 12 and 13 are disposed laterally and the np junction 14 extends vertically as far as the substrate surface. The p type region is obtained by implantation of boron ions whereas the n type region is obtained by implantation of phorophorus ions. At the edge of the n type region 12 opposite from the junction 14, there is formed by diffusion in the substrate 11, an n+ type region 15 while at the edge of the p type region 13 opposite from the junction 14, there is formed by diffusion a p+ type region 16. The structure thus formed is covered by a silicon dioxide layer 17 which includes a thin region 18 above the regions 12 and 13 and the junction 14.

A gate 19 is formed by a conductive element, for example aluminum, disposed on the thin portion 18 of the silicon dioxide layer 17 which provides a gate insulating layer. The gate 9 is isolated with respect to the rest of the circuit and is referred to as a floating gate. Finally, conductive contact elements 20 and 21 are disposed on the silicon dioxide layer 17 and provide terminals for the regions 15 and 16 respectively.

In the resulting cell, the single ion implanted pn junction 14 assures in turn the function of negative charge (electron) injection and that of positive charge (hole) injection while in memory cells according to previous techniques, these two functions were provided by two separate n+p and p+n regions.

While providing a vis-a-vis cells having two separate junctions, a certain number of advantageous such as simplicity and compactness, the single charge injector cell—hereinafter referred to as a single injector—has not to the present attained the performance of cells according to previous techniques. Such a single injector cell makes it inconvenient to assure at least as good injection of holes as in prior structures.

According to one aspect of the present invention, there is provided a memory cell having a single charge injector and a floating gate, such as disclosed by application Ser. No. 839,722, wherein the junction forming the charge injector, selectively operable to inject either electrons or holes onto the floating gate at the time of application of a reverse potential at least equal to the avalanche threshold of the junction, comprises in a semiconductor substrate of one conductivity type, a first region of opposite conductivity type, preferably doped by ion implantation, and a second region of the same conductivity type as a substrate, preferably formed by diffusion, but having a dopant concentration greater than that of the substrate, the floating gate being disposed above the first and second regions and separated therefrom by a thin insulating layer.

According to another aspect of the present invention, a charge injector, floating gate memory cell comprises a single junction forming a charge injector selectively operable to inject either electrons or holes onto the floating gate on application to that junction of a reverse bias polarity at least equal to the avalanche threshold of that junction, and means for controlling the operation of that junction in an electron injection mode or in a hole injection mode, the control means comprising an address transistor and a read transistor both connected to the injector junction, the read transistor being a high threshold voltage transistor having a thicker gate isolating layer than that associated with the floating gate.

Other characteristics of the invention will appear in the course of the following description, given by way of example only, of illustrative embodiments described with reference to the drawings in which:

FIGS. 1 and 2 exemplifies prior art as described above;

FIG. 14 is a diagram showing the floating gate potential at different times during operation of a cell in FIGS. 6 and 7; and FIG. 15 is a schematic representation of a matrix of memory cells as shown in FIGS. 6 and 7.

Figure 1:
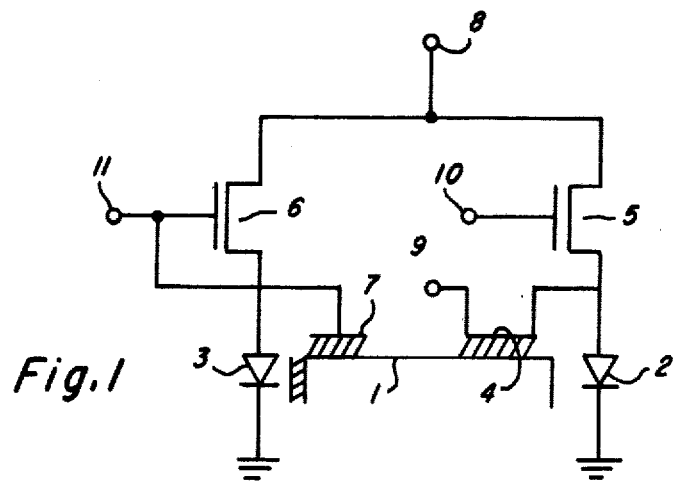
Figure 3:
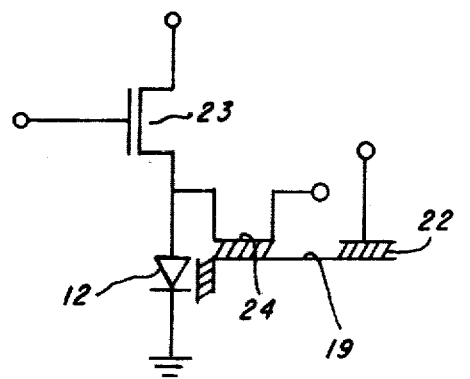
FIG. 3 is a sectional view of an improved memory cell.
Figure 4:
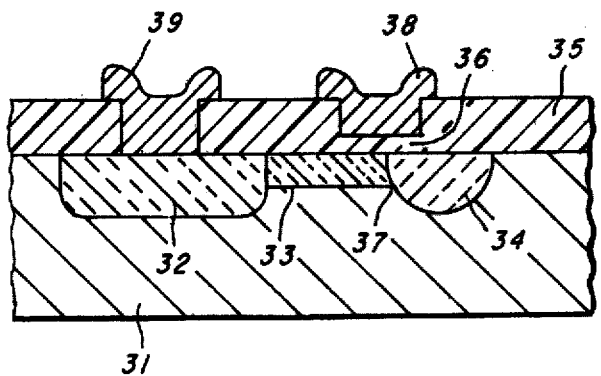
FIG. 4 is a schematic view of a floating gate memory cell having a single charge injector as shown in FIG. 4.

A memory cell structure according to an embodiment of one aspect of the present invention is shown in FIGS. 3 and 4. This cell comprises an n-type substrate 31 in the upper surface of which are formed a p+ doped region 32, a p type region 33 in contact with the region 32 and an n+ type region 34 contacting the region 33. Only the p type region 33 is produced by ion implantation while the n+ type region is produced by thermal diffusion. The regions 33 and 34 thus define a combined electron and hole injector diode. This structure utilizes the recognition that to achieve efficient injection of electrons and holes, it is necessary to make the single injection diode assymetrical in terms of doping favoring hole injection, in order to compensate for hole mobility being less than that of electrons. The hole injection resulting from such a non-symmetrical n+/p junction structure of the double injector cell can be made as efficient for electron injection as the electron injector provided by the p+n diode of a conventional memory cell, such as illustrated by FIG. 1, employing separate hole and electron injector diodes.

The resultant structure is covered by a silicon dioxide layer 35 which includes a thin portion 36 above the junction 37 defined by the diode regions 33 and 34. A conductive floating gate 38 is disposed on the thin portion 36 of the silicon oxide layer 35. A contact element 39 on the oxide layer 35 provides a terminal to the region 32.

Injection of electrons or holes is selected according to the polarity of the electric field applied across the thin oxide layer 36, that is to say, by the voltage applied to the coupling capacitor 30 connected to the floating gate 38, this voltage being either zero or negative n in the case of the cell described with reference to FIG. 1. The cell described also includes a single address transistor 23 and a read transistor 24.

Fabrication steps suitable for fabrication of a single charge injector memory cell as described with reference to FIGS. 3 and 4, are exemplified in more detail in the above-mentioned U.S. patent application Ser. No. 839,722 and specifically incorporated herein by reference. By way of summary, in the memory cell structure disclosed in application Ser. No. 839,722, the single pn injector structure is obtained by successive boron and phosphorus ion implantations. For example, p region—boron implantation, 30 kev energization and $10^{13}$–$10^{14}$ atoms/cm$^2$ dosage; n region—phosphorus implantation 60 kev energization and $10^{13}$–$10^{14}$ atoms/cm$^2$ dosage. This produces two opposite conductivity type regions having equivalent surface concentrations of $10^{17}$–$10^{18}$ atoms/cm$^3$.

In the case of a cell structure embodying the present invention as illustrated by FIGS. 3 and 4, the n+/p injector diode is formed by thermal diffusion followed by ion implantation. For example, n+ region—thermal diffusion of phosphorus corresponding to concentration of about $10^{19}$–$10^{20}$ atoms/cm$^3$; p region—boron implantation, 70 kev energization and $10^{13}$ atoms/cm$^2$ dosage, leading to a surface impurity concentration on the order of $10^{17}$ atoms/cm$^3$.

It can be seen therefore that the method of fabricating a cell structure embodying the present invention produces an abrupt junction (n region 34 much more highly doped than the p region 33) in contradistinction from the cell structure disclosed in application Ser. No. 839,722 and exemplified herein with reference to FIG. 2.

Figure 5:
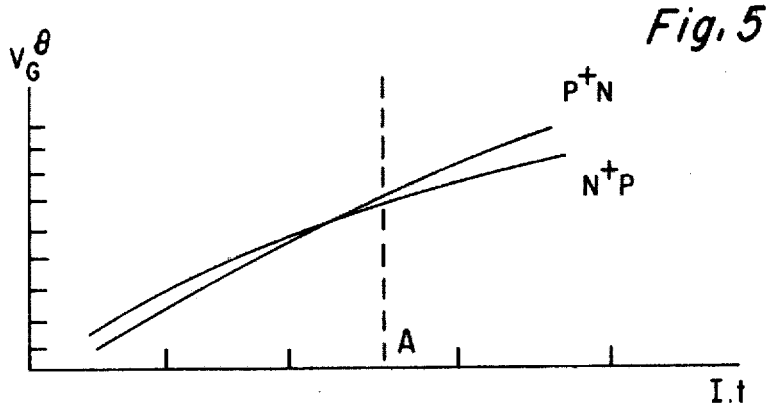
FIG. 5 is a graph showing variation of the floating gate potential as a function of write conditions for a p+n junction and for n+p junction.

In FIG. 5 there is shown the negative potential of the floating gate 38 after a write operation, as a function of the write conditions, that is to say the product of time and avalanche current of the injection diode, both from a p+/n diode and an n+/p diode, having the same avalanche breakdown voltage. In the region of normal operating conditions of the memory cell (A in FIG. 5) the p+/n and n+/p diodes having practically the same electron injection efficiency.

Consequently, the n+/p injector provides in the same element the properties of the two p+/n and n+/p injectors: It is sufficient therefore on the basis of a conventional double injector cell to eliminate purely and simply the p+/n injector to obtain a single injector cell such as shown and described with reference to FIGS. 3 and 4, having unchanged write and erase performances.

Figure 2:
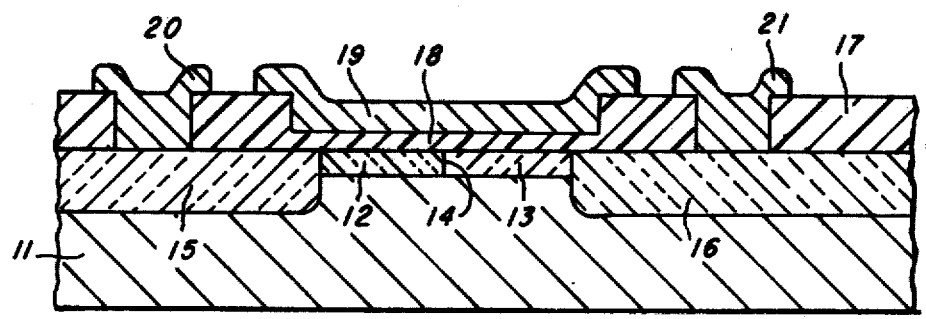

As a result of this very simple structure, the single injector n+/p diode cell provides the advantages of increased degree of integration compared with the symmetrical single junction cell shown in FIG. 2. Moreover, the single n+/p injector is very simple to fabricate since after growth of the thin silicon oxide layer, only a single implantation operation is required to define the p region, instead of 2 steps in the case of the p/n injector diode of FIG. 2.

Figure 6:
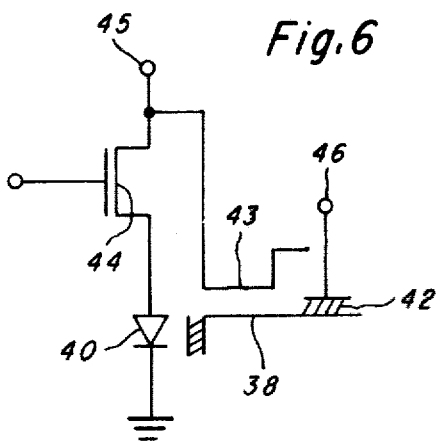
FIG. 6 is a schematic view of a modification of the improved floating gate memory cells shown in FIGS. 3 and 4.
Figure 7:
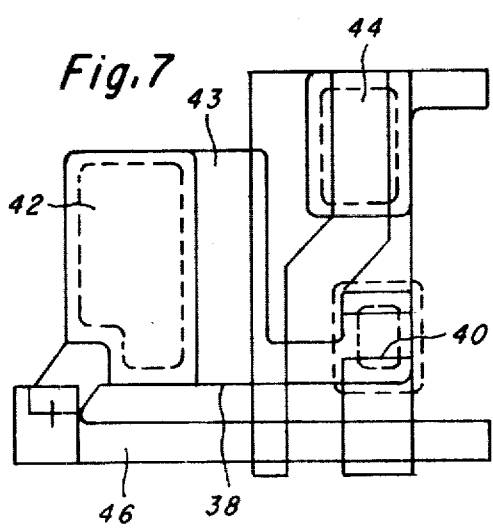
FIG. 7 is a topographical view of the cell shown in FIG. 6.

A novel and advantageous memory cell incorporating the structure shown in FIG. 4 is further illustrated in FIGS. 6 and 7. This cell incorporates a single n+/p charge injector diode 40 corresponding to the diode defined between regions 33 and 34 in FIG. 4. The floating gate 38 is connected to a coupling capacitor 42, itself connected to a read transistor 43 which, according to a further aspect of the present invention is a thick gate oxide transistor having a high threshold voltage. This voltage may be, for example, about −25 volts instead of −1 volt in the case of a cell structure such as shown in FIG. 3. Otherwise, the memory cell circuit shown in FIG. 6 is similar to that of the cell shown in FIG. 3. This memory cell comprises also an address transistor 44 having a terminal 45 for writing, erasing and reading of the cell. The various elements of the schematic circuit of FIGS. 6 are also shown in the topographical integrated circuit layout of FIG. 7. It will be noted the channel of the read transistor is located between the injector diode 40 and the capacitor 42, permitting a compact cell structure, and hence higher cell density in an integrated circuit structure, to be obtained.

The various steps involved in fabrication of a memory cell structure as shown in FIGS. 6 and 7 will now be described with reference to FIGS. 8-13.

Figure 8:
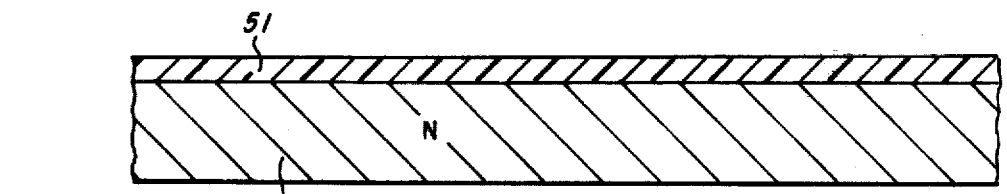
FIGS. 8–13 are views in sectional elevation of steps in the fabrication of a memory cell as depicted by FIGS. 6 and 7.

In FIG. 8, a doped bar of silicon forms a substrate 50 of the cell and is thermally oxidized to provide an initial oxide layer 51 having a thickness between about 4,000-8,000 Angstroms.

Figure 9:
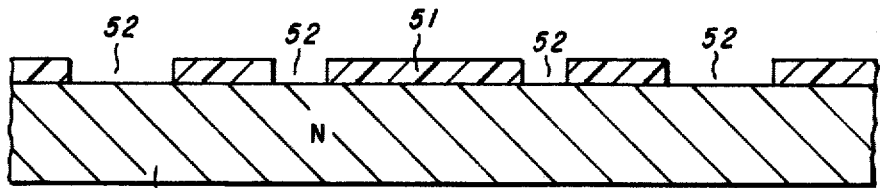
Figure 10:
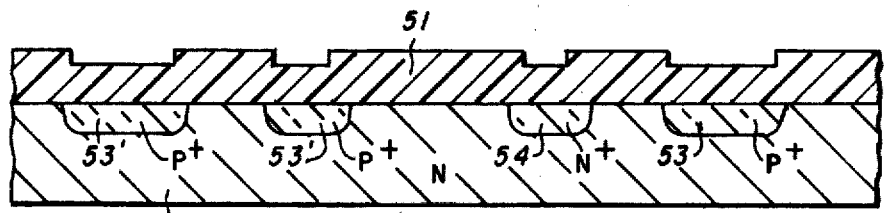

By means of conventional photolithographic techniques, openings 52 are formed in the initial oxide layer as shown in FIG. 9, to permit successive formation by diffusion of p+ regions 53 and 53¹ and an n+ region 54. The result of these operations is shown in FIG. 10. The junction depths of these p+ and n+ regions is about 1 to 2 microns.

Figure 11:
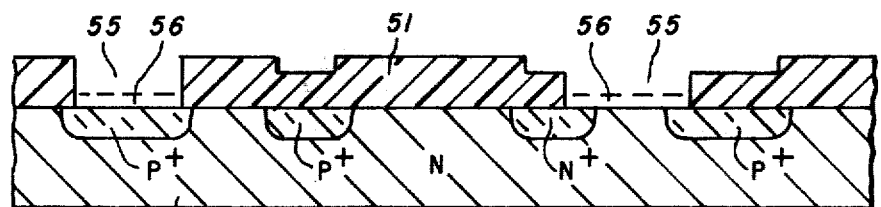
Figure 12:
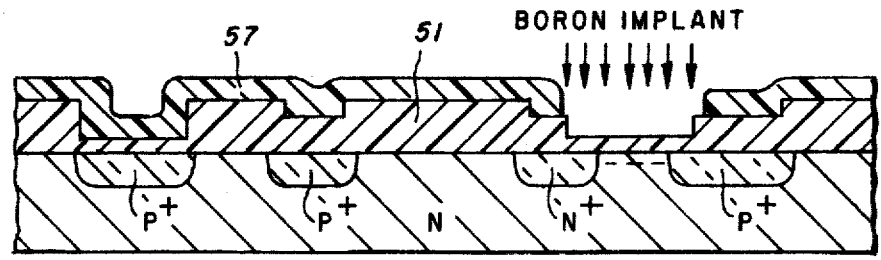

During formation the p+ and n+ regions the diffusion time is adjusted so that the initial oxide layer which increases during these operations attains a thickness of about 11,000 to 13,000 Angstroms in such manner that the threshold voltage of the thick oxide read transistor defined by the two diffused zones 53¹ as shown in FIG. 10 is in the region of $-25$ volts. Also by conventional photolithographic techniques, regions 55 are formed by growing a thin isolating layer 56 of silicon dioxide as shown in FIG. 11. The resulting structure is covered by a layer 57 of photoresist resin to define a region in which is to be created by ion implantation a p region of the n+/p injector. This implantation schematically represented in FIG. 12 is produced by implantation of boron ions using an energy of 30 to 60 kev and a dosage of 1 to $4 \times 10^{13}$ atoms/cm².

Figure 13:
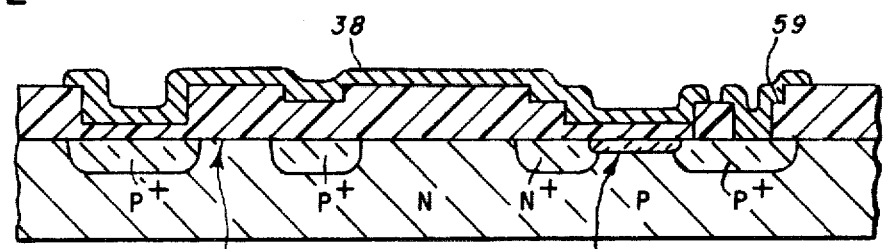

After removal of the photoresist layer 57, a metal layer obtained by a vacuum deposit is masked to define metallic conductors which interconnect the different elements of the structure, the floating gate 38, the terminal 59 of the n+/p injector well as the access terminals to the two other diffused p+ regions and which are not represented in FIG. 13. These two p+ diffused regions form part of the read transistor 43 and an electrode of the coupling capacitor 42 shown in FIG. 6.

The manner of operation of this memory cell will be described with reference to FIG. 14.

During the write operation, the address transistor 54 is made conductive while the terminal 46 is held at zero potential. On application to the terminal 45 of a potential more negative than the breakdown potential of the n+/p diode 40, electrons are injected onto the floating gate 38 which is charged negatively to a potential of about $-8$ V in the present example.

During the read operation, the address transistor 44 is made non-conductive, the terminal 45 is held a zero potential and a highly negative potential, of the order of $-30$ V for example, is applied to the terminal 46. Through capacitive coupling a negative potential equal to $(-30 \times K)$ where K is the coefficient of coupling between the capacitor 42 and the floating gate 38—is superposed on the negative potential attained by the floating gate following the write sequence. If K is chosen to be about 0.8 and the floating gate 38 is held at a potential of $-32$ V, the read transistor 43 has a threshold voltage of about $-25$ V and is therefore conductive.

For erasing as well as for writing, the injector 40 is operated in an avalanche mode, but this time the terminal 46 is held at a very negative potential, suitably about $-30$ V, to inject holes using the same principle as utilized in the memory cell as described with reference to FIG. 4.

After the erase operation, the floating gate 38 has a slightly positive potential, about $+2$ V for example. During reading, the same conditions previously described are applied. Through capacitive coupling effect, during the read sequence, the floating gate 38 is held at a potential of $-22$ V. Under these conditions, the read transistor 43 is blocked.

In FIG. 15, there is shown a matrix of cells as shown in FIGS. 6 and 7. The cells 60 which are all identical to the cell shown in FIG. 6, are interconnected by horizontal word lines 61, and by vertical bit lines 62.

Because of the use of read transistors 53 having a high threshold voltage, it is possible to ensure that no interaction occurs between cells during the write, erase and read operations.

The memory cell as described have with reference to FIGS. 6-15 provide in relation to previous cells, the following advantages:

The structure of the read transistor does not necessitate any critical operation, so that it is sufficient to use an oxide thickness obtained during the initial operation.

Only two ion implantations are required, namely an implantation for the address transistor 54 and one for the injector 40.

The design and fabrication of a cell embodying the invention is simplified with respect to the previously known cells. A cell embodying the invention as shown in FIGS. 6 and 7 only three access terminals instead of four for conventional cells.

The parasitic capacitance of such a memory cell is reduced to a low level. Now, given that this parasitic capacitance enters into the determination of the coupling coefficient K, this permits a constant coefficient K reducing the surface area of the coupling capacitor 42 by a fact of 3 for example, with respect to the memory cell described with reference to FIGS. 3 and 4.

The memory cell shown in FIGS. 6 and 7, instead of comprising a thin oxide read transistor is provided with a thick oxide read transistor, thereby facilitating the cell design and permitting realization of a very compact design and assuring a reduction in the total surface area of the floating gate with respect to that of the cell as described with reference to FIGS. 3 and 4, by a factor of about 1.5.

The combined advantages of the memory cell as described with reference to FIGS. 6 and 7 permit realization of a higher integration density than in the case previous techniques.

The cell which has been described has been by way of example. It is to be understood that the invention can be applied to cells formed in a p type or an n type substrate using indifferently a p+/n or n+/p injector.

What is claimed is:

1. A semiconductor memory cell including a semiconductor substrate of one conductivity type, an electrically isolated floating gate conductor overlying said substrate, combined hole and electron injector means defined by a single pn junction located in said substrate under said floating gate for selective operation in avalanche breakdown for alternatively injecting electrons or holes onto said gate, and control means for selectively applying operating voltages across said single injector means and to said floating gate for operating said injector means in an electron injector mode or in a hole injector mode, wherein said single injector pn junction is an abrupt junction defined by a first region having an opposite conductivity from that of the substrate and a second region having the same conductivity type as but greater impurity concentration than that of said substrate, the abrupt junction defined by regions having impurity concentrations differing from each other to the extent that said injector junction has substantially the same injection efficiency when operated in said hole injection mode or in said electron injection mode.

2. A semiconductor memory cell including a monocrystalline semiconductor substrate of one conductivity type, an electrically isolated floating gate conductor overlying said substrate, a combined hole and electron injector means having a single junction means defined by semiconductor regions of opposite conductivity types occupying laterally extending regions of said substrate beneath said floating gate conductor and defining between them a single pn junction means extending into the substrate transversely of the floating gate conductor for selective operation in avalanche breakdown for alternatively injecting holes or electrons onto said gate, and means for selective operation of said single junction means in a hole injection mode or in an electron injection mode including means connected to said semiconductor regions for applying a voltage across said region to bias said single junction at least to avalanche breakdown threshold and means for selectively capacitively coupling a bias voltage to said floating gate, wherein the single injector pn junction means is an abrupt junction defined between a first region doped by ion implantation to have an opposite conductivity type from that of said substrate and a second region doped by thermal diffusion to have the same conductivity type as but greater impurity concentration than that of said substrate, the impurity concentrations of the first and second regions defining the single injector junction being such that said injector junction has substantially the same injection efficiency in both said hole injection mode and in said electron injection mode.

3. A semiconductor memory cell structure according to claim 1 or 2, wherein said substrate comprises n- type silicon, said first region has p-type conductivity and said second region has n+ type conductivity.

4. A semiconductor memory cell including
a semiconductor substrate of n- conductivity type having a surface overlaid by a layer of insulating material;
a floating gate conductor on and insulated from said substrate by said insulating layer;
combined hole and electron injector means comprising first and second laterally disposed surface regions respectively of p and n+ conductivity types in said substrate beneath said floating gate and defining between them a single junction extending into said substrate beneath and transversely of said floating gate conductor for operation in avalanche breakdown for alternatively injecting holes or electrons into and through said insulating layer for storage on said floating gate conductor, said n+ type region dopant concentration being sufficient to substantially compensate for hole mobility being lower than that of electron mobility thereby to provide said combined hole and electron injector means with approximately equal electron and hole injection efficiencies; bootstrap capacitor means coupled to said floating gate conductor and comprising an enlarged area extension of said gate conductor and regions of said insulating layer and substrate respectively underlying said enlarged area extension;
and means for selectively operating said single junction in said hole injection mode or in said electron injection mode, said operating means including means for applying an avalanche breakdown bias across said single junction in the selective presence or absence of a bias voltage across said bootstrap capacitor means.

5. A semiconductor memory cell according to claim 4, wherein said p type region is an ion implanted doped region and wherein said n+ type region is a thermally diffused doped region.

6. Floating gate injector memory cell comprising a single charge injector junction for injecting either electrons or holes onto the floating gate on application to the junction of a reverse bias at least equal to the avalanche threshold of that junction and means for controlling operation of the junction in an electron injection mode or in a hole injection mode, said floating gate overlying said charge injector junction and separated therefrom by a thin isolating layer, the control means comprising an address transistor and a read transistor both connected to the injector junction, wherein the read transistor has a thick gate isolating layer and a high threshold voltage, the read transistor having a channel located between said charge injection junction and capacitor means for coupling a bias voltage to said floating gate.

7. Memory cell according to claim 6, having three access terminals including an electrode for reading, erasing and writing; a control terminal for the address transistor; and a control terminal for the read transistor.

8. Memory cell according to either of claims 6 or 7, wherein the read transistor having a thick gate isolating layer is permanently coupled by a capacitor to the floating gate.

9. Memory cell according to claim 6 or claim 7 or claim 8, wherein the thick gate isolating layer of the read transistor is an oxide layer.

10. A semiconductor memory cell including a semiconductor substrate of one conductivity type, a floating gate conductor overlying said substrate and separated therefrom by an electrical isolating layer, combined hole and electron injector means defined by a single pn junction located in said substrate under said floating gate for selective operation in avalanche breakdown for alternatively injecting electrons or holes onto said gate, and control means for selectively applying operating voltages across said single injector junction means and to said floating gate for operating said single injector means in an electron injector mode or in a hole injector mode, wherein said single injector pn junction is an abrupt junction defined by a first region having an opposite conductivity from that of the substrate and a second region having the same conductivity type as but greater impurity concentration that that of said substrate such that said single injector means has substantially the same injection efficiency when operated in said hole injector mode as in said electron injection mode; and said control means comprises an address transistor and a read transistor both connected to said single pn junction, said read transistor having a thicker gate isolating layer than that of the floating gate.

11. A semiconductor memory cell including a monocrystalline semiconductor substrate of one conductivity type, a floating gate conductor overlying said substrate and separated therefrom by a thin isolating layer, a combined hole and electron injector means having a single junction means defined by semiconductor regions of opposite conductivity types occupying laterally extending regions of said substrate beneath said floating gate conductor and defining between them a single pn junction means extending into the substrate transversely of the floating gate conductor for selective operation in avalanche breakdown for alternatively injecting holes or electrons onto said gate, and control means for selective operation of said single junction means in a hole injection mode or in an electron injection mode including means connected to said semiconductor regions for applying a voltage across said region to bias said single junction at least to avalanche breakdown threshold and means for selectively capacitively coupling a bias voltage to said floating gate; wherein the single injector pn junction means is an abrupt junction defined between a first region doped by ion implantation to have an opposite conductivity type from that of said substrate and a second region doped by thermal diffusion to have the same conductivity type as but greater impurity concentration than that of said substrate, the impurity concentrations of the first and second regions defining the single injector junction being such that said injector junction has substantially the same injection efficiency in both said hole injection mode and in said electron injection mode; and wherein said control means includes a read transistor having a channel located adjacent said single injector pn junction with one region of said junction defining one end of said channel, said read transistor having a gate electrode overlying said channel separated therefrom by an isolating layer having a thickness significantly greater than that of said floating gate isolating layer.

12. A semiconductor memory cell including
a semiconductor substrate of n- conductivity type having a surface overlaid by a layer of insulating material;
a floating gate conductor on and insulated from said substrate by a thin region of said insulating layer;
combined hole and electron injector means comprising first and second laterally disposed surface regions respectively of p and n+ conductivity types in said substrate beneath said floating gate and defining between them a single junction extending into said substrate beneath and transversely of said floating gate conductor for operation in avalanche breakdown for alternatively injection holes or electrons into and through said insulating layer for storage on said floating gate conductor, said n+ type region dopant concentration being sufficient to substantially compensate for hole mobility being lower than that of electron mobility thereby to provide said combined hole and electron injector means with approximately equal electron and hole injection efficiencies; bootstrap capacitor means coupled to said floating gate conductor and comprising an enlarged area extension of said gate conductor and regions of said insulating layer and substrate respectively underlying said enlarged area extension;
control means for selectively operating said single junction in said hole injection mode or in said electron injection mode by applying an avalanche breakdown bias across said single junction in the selective presence or absence of a bias voltage across said bootstrap capacitor means, said control means including address and read insulated gate field effect transistor having channels connected in series with each other and with said single injector junction, said read transistor having a gate electrode separated from said substrate by a region of said insulating layer having a thickness substantially greater than that beneath said floating gate, the read transistor gate insulating layer region being located between said single injector junction and said bootstrap capacitor means.

13. A semiconductor memory cell according to claim 12, having only three access terminals consisting of a first electrode for reading, writing and erasing, and a second and third gate control terminal for said read and write transistors.

14. A semiconductor memory cell according to claim 12, wherein said p type region is an ion implanted doped region and wherein said n+ type region is a thermally diffused doped region.

* * * * *